(12) United States Patent
Richards et al.

(10) Patent No.: US 10,683,572 B2
(45) Date of Patent: Jun. 16, 2020

(54) SILANE RECIRCULATION FOR RAPID CARBON/SILICON CARBIDE OR SILICON CARBIDE/SILICON CARBIDE CERAMIC MATRIX COMPOSITES

(71) Applicant: GOODRICH CORPORATION, Charlotte, NC (US)

(72) Inventors: Gavin Charles Richards, Poughkeepsie, NY (US); Tod Policandriotes, Suffield, CT (US); Afshin Bazhushtari, Rolling Hills Estates, CA (US)

(73) Assignee: Goodrich Corporation, Charlotte, NC (US)

( * ) Notice: Subject to any disclaimer, the term of this patent is extended or adjusted under 35 U.S.C. 154(b) by 83 days.

(21) Appl. No.: 16/160,930

(22) Filed: Oct. 15, 2018

(65) Prior Publication Data

US 2020/0115799 A1 Apr. 16, 2020

(51) Int. Cl.
*C23C 16/455* (2006.01)
*C23C 16/32* (2006.01)
*C23C 16/50* (2006.01)

(52) U.S. Cl.
CPC ...... *C23C 16/45593* (2013.01); *C23C 16/325* (2013.01); *C23C 16/50* (2013.01)

(58) Field of Classification Search
None
See application file for complete search history.

(56) References Cited

U.S. PATENT DOCUMENTS

| 5,334,414 A | 8/1994 | Edie et al. |
| 6,051,053 A * | 4/2000 | Noji ..................... B01D 8/00 95/133 |
| 6,187,379 B1 | 2/2001 | Lackey |
| 6,197,374 B1 | 3/2001 | Huttinger et al. |

(Continued)

FOREIGN PATENT DOCUMENTS

| EP | 0665305 | 8/1995 |
| IN | 201102261 | 8/2012 |

(Continued)

OTHER PUBLICATIONS

European Patent Office, European Search Report dated Apr. 9, 2020 in Application No. 19202948.6.

*Primary Examiner* — Joseph A Miller, Jr.
(74) *Attorney, Agent, or Firm* — Snell & Wilmer L.L.P.

(57) ABSTRACT

A system for chemical vapor densification includes a reaction chamber having an inlet and outlet; a trap; a conduit fluidly coupled between the outlet of the reaction chamber and the trap; a cryogenic cooler fluidly coupled to the trap though a frustoconical conduit; a first exit path from the cryogenic cooler that vents hydrogen gas to an exhaust; and a second exit path from the cryogenic cooler that recirculates silane and hydrocarbon-rich gas back to the inlet of the reaction chamber—and a related method places a substrate in the reaction chamber; establishes a sub-atmospheric pressure inert gas atmosphere within the reaction chamber; densifies the substrate by inputting virgin gas into the reaction chamber; withdraws effluent gas from the reaction chamber; extracts silane and hydrocarbon-rich gas from the effluent gas; and recirculates the silane and hydrocarbon-rich gas back to the reaction chamber.

8 Claims, 3 Drawing Sheets

(56) References Cited

U.S. PATENT DOCUMENTS

| | | | |
|---|---|---|---|
| 8,568,838 B2 | 10/2013 | Chang et al. | |
| 9,938,618 B2 | 4/2018 | Policandriotes et al. | |
| 2009/0120286 A1* | 5/2009 | Schmid | C23C 16/4412 |
| | | | 95/39 |
| 2009/0238972 A1* | 9/2009 | Clark | C23C 16/24 |
| | | | 427/255.28 |
| 2011/0206842 A1* | 8/2011 | Revankar | C23C 16/4412 |
| | | | 427/248.1 |
| 2014/0356534 A1* | 12/2014 | Hegermann | C23C 16/26 |
| | | | 427/249.2 |
| 2015/0152547 A1* | 6/2015 | Nakamura | C23C 16/455 |
| | | | 427/249.3 |
| 2016/0281218 A1* | 9/2016 | Policandriotes | C23C 16/26 |
| 2018/0030593 A1 | 2/2018 | Policandriotes | |
| 2018/0127870 A1 | 5/2018 | Losego et al. | |

FOREIGN PATENT DOCUMENTS

| | | |
|---|---|---|
| IN | 277858 | 12/2016 |
| JP | 03198157 | 8/2001 |
| JP | 03374169 | 2/2003 |
| JP | 03548605 | 7/2004 |
| JP | 03557939 | 8/2004 |
| JP | 03682094 | 8/2005 |
| JP | 04784533 | 10/2011 |
| JP | 05215306 | 6/2013 |
| MX | 2002008746 | 2/2003 |
| WO | 2010035692 | 4/2010 |
| WO | 2011062254 | 5/2011 |
| WO | 2016193579 | 12/2016 |
| WO | 2018068035 | 4/2018 |

\* cited by examiner

SILANE RECIRCULATION FOR RAPID CARBON/SILICON CARBIDE OR SILICON CARBIDE/SILICON CARBIDE CERAMIC MATRIX COMPOSITES

FIELD

The present disclosure relates to chemical vapor infiltration (CVI) and/or carbon vapor deposition (CVD) processes used to densify components, including systems and methods of chemical vapor densification using recirculated and/or recycled hydrocarbon, silane, and/or carbosilane gases.

BACKGROUND

Carbon fiber and carbon matrix (C/C) composites are used in the aerospace industry to manufacture aircraft brake heat sink materials, among other applications. Similarly, silicon carbide (SiC) based ceramic matrix composites (CMCs) are also used as suitable aircraft brake materials, as well as within other industries, too (e.g., automotive, locomotive, engines, etc.). In various embodiments, CMC composites are produced using, for example, chemical vapor infiltration (CVI) and/or chemical vapor deposition (CVD) processes. Referring generally, CVI and CVD processes place substrates (e.g., porous preforms) into reactor furnaces and introduce gaseous precursors to form SiC depositions within the pores of the substrates. The SiC may be deposited in a series of one or more infiltrations coatings, including whereby the substrates are densified with carbon or other constitutents and then with SiC, or with SiC and then carbon or other constitutents. This collective process is generally referred to as chemical vapor densification.

In various CVI and CVD densification processes, by-product deposits accumulate within various components of CMC manufacturing systems, such as within their exhaust piping and/or plumbing systems. Since the by-product deposits can be reactive, and even pyrophoric, various precautions are undertaken to promote safe manufacturing environments. For example, conventional CMC manufacturing systems are shut down for lengthy periods of time while operators manually clean the components and piping to remove the by-product deposits. However, since these cleaning procedures involve shutting down the CMC manufacturing systems for periods of time, they decrease the systems' capacities and throughputs. In addition, build-up of condensable hydrocarbon tars from conventional carbon CVI and CVD processes, although not pyrophoric in nature, can also cause unintended reactions within various CMC manufacturing systems.

SiC deposition commonly uses methyltrichlorosilane (MTS) as a source chemical. By-products from decomposing MTS, however, include the afore-mentioned pyrophoric condensates, as well as hydrochloric acid. These caustic effluents require suitable mitigation, and eliminating and/or reducing them increases CMC manufacturing systems' and/or methods' throughput, among other benefits. In addition, unused hydrocarbon reaction exhaust and other gases (effluent) can be burned off and/or used to power an externality. Also, reducing processing time and waste can reduce the costs of production and the emission of greenhouse gases.

SUMMARY

In various embodiments: a system for chemical vapor densification includes at least the following: a reaction chamber having an inlet and outlet; a trap; a conduit fluidly coupled between the outlet of the reaction chamber and the trap; a cryogenic cooler fluidly coupled to the trap though a frustoconical conduit; a first exit path from the cryogenic cooler that vents hydrogen gas to an exhaust; and a second exit path from the cryogenic cooler that recirculates silane and hydrocarbon-rich gas back to the inlet of the reaction chamber.

In various embodiments, the trap and the cryogenic cooler are configured to extract the silane and hydrocarbon-rich gas; and/or the trap is configured to filter at least one of hydrocarbon including four or more carbon atoms, silane including three or more silicon atoms, and carbosilane including a combination of four or more carbon or silicon atoms; and/or the cryogenic cooler is configured to condense at least one of hydrocarbon including four or more carbon atoms, silane including three or more silicon atoms, and carbosilane including a combination of four or more carbon or silicon atoms; and/or the cryogenic cooler is cooled by helium; and/or the cryogenic cooler is cooled by liquid nitrogen; and/or an electric arc is intermediate the outlet and the trap; and/or the electric arc creates a plasma material; and/or the plasma material is configured to fragment at least one of hydrocarbon including four or more carbon atoms, silane including three or more silicon atoms, and carbosilane including a combination of four or more carbon or silicon atoms; and/or a thermal oxidizer is at a terminal end of the first exit path.

In various embodiments: a method of chemical vapor densification includes at least the following: placing a substrate in a reaction chamber; establishing a sub-atmospheric pressure inert gas atmosphere within the reaction chamber; densifying the substrate by inputting virgin gas into the reaction chamber; withdrawing effluent gas from the reaction chamber; extracting silane and hydrocarbon-rich gas from the effluent gas; and recirculating the silane and hydrocarbon-rich gas back to the reaction chamber.

In various embodiments, the method further includes extracting hydrogen gas from the effluent gas; and/or oxidizing the hydrogen gas to react any silane contaminants that are not extracted from the effluent gas; and/or venting the hydrogen gas to an exhaust; and/or the extracting includes applying an electric arc to the effluent gas, and wherein the electric arc fragments at least one of hydrocarbon including four or more carbon atoms, silane including three or more silicon atoms, and carbosilane including a combination of four or more carbon or silicon atoms; and/or the extracting includes filtering at least one of hydrocarbon including four or more carbon atoms, silane including three or more silicon atoms, and carbosilane including a combination of four or more carbon or silicon atoms; and/or the extracting includes condensing at least one of hydrocarbon including four or more carbon atoms, silane including three or more silicon atoms, and carbosilane including a combination of four or more carbon or silicon atoms; and/or the method further includes additionally densifying the substrate using the recirculated silane and hydrocarbon-rich gas.

In various embodiments: a method of chemical vapor densification includes at least the following: placing a substrate in a reaction chamber; establishing a sub-atmospheric pressure inert gas atmosphere within the reaction chamber; densifying the substrate by inputting virgin gas into the reaction chamber; withdrawing effluent gas from the reaction chamber; extracting silane and hydrocarbon-rich gas from the effluent gas; recirculating the silane and hydrocarbon-rich gas back to the reaction chamber; extracting hydrogen from the effluent gas; oxidizing the hydrogen to react any silane contaminants that are not extracted from the effluent gas; venting the hydrogen to an exhaust; and additionally densifying the substrate using the recirculated silane and hydrocarbon-rich gas; wherein the extracting silane and hydrocarbon-rich gas from the effluent gas includes filtering and condensing at least one of hydrocarbon including four or more carbon atoms, silane including three or more silicon atoms, and carbosilane including a combination of four or more carbon or silicon atoms.

In various embodiments, the extracting silane and hydrocarbon-rich gas from the effluent gas further includes applying an electric arc to the effluent gas, and wherein the electric arc begins fragmenting the hydrocarbon, silane, or carbosilane molecules.

Figure 1:
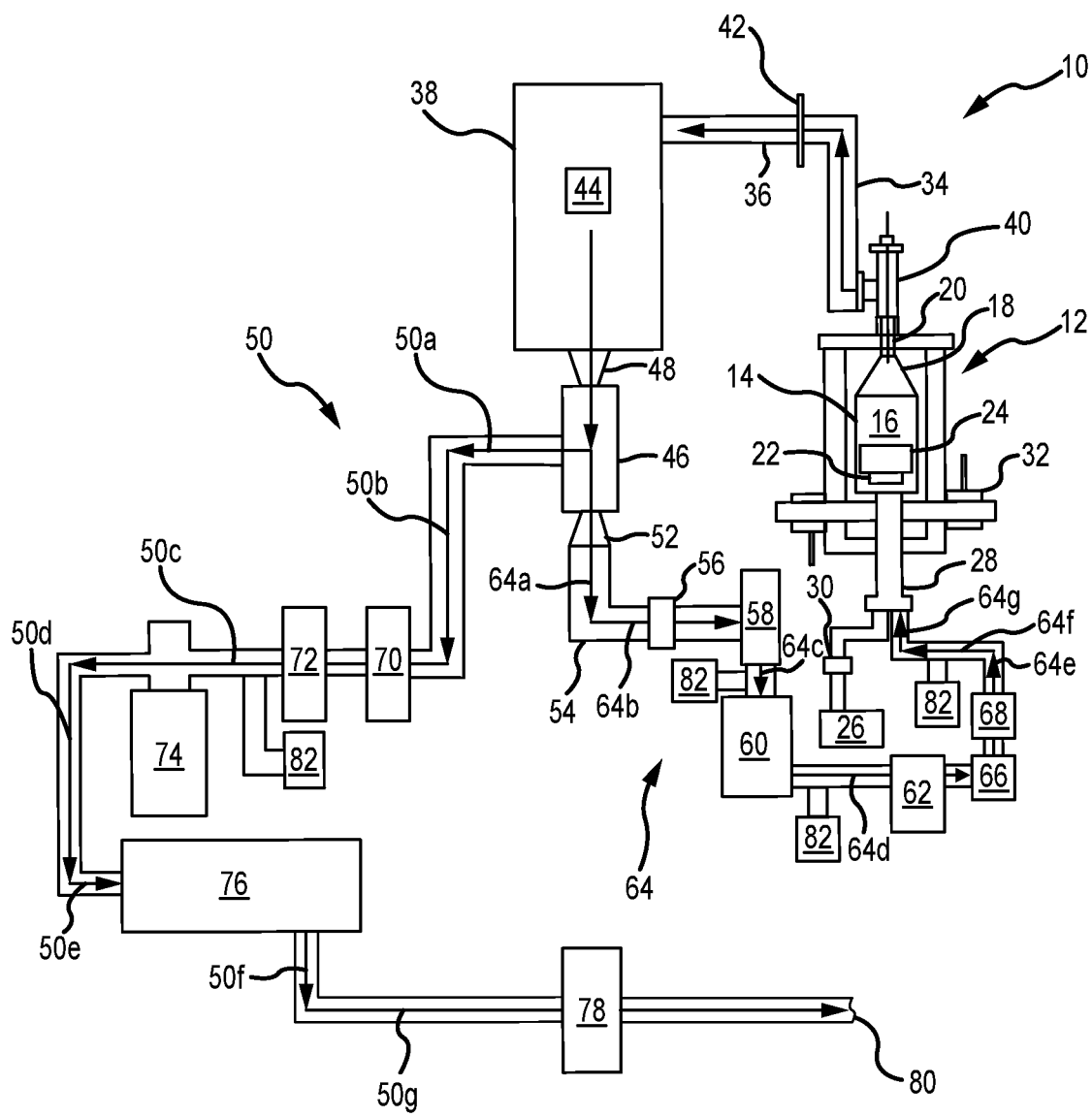
FIG. 1 illustrates a schematic diagram of a system for chemical vapor deposition comprising an exit path and a recirculation path used to densify components within a reaction chamber, in accordance with various embodiments.

The subject matter of the present disclosure is particularly pointed out and distinctly claimed in the concluding portion of the specification. A more complete understanding of the present disclosure, however, may be obtained by referring to the detailed description and claims when considered in connection with the drawing figures, wherein like numerals generally denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the exemplary embodiments of the disclosure, it should be understood that other embodiments may be realized and that logical changes and adaptations in design and construction may be made in accordance with this disclosure and the teachings herein. Thus, the detailed description herein is presented for purposes of illustration only and not limitation. The steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Referring now to FIG. 1, a system 10 for chemical vapor densification (e.g., chemical vapor infiltration (CVI) and/or chemical vapor deposition (CVD)) is illustrated, comprising both an exit path and a recirculation path, as elaborated upon further herein. In various embodiments, the system 10 is particularly suited for densifying carbon, such as carbon fiber and/or carbon matrix (C/C) composites, as well as silicon carbide (SiC) based ceramic matrix composites (CMCs), etc.—such as suitable for use, for example, in the aerospace industry, including for making aircraft brake heat sink materials, as well as for other various applications, too.

Referring now more specifically, the system 10 includes a reaction chamber 12 having a retort 14 that defines a reaction zone 16 within the reaction chamber 12. In various embodiments, the retort 14 comprises a lid 18 that is configured to have a Venturi effect. For example, in various embodiments, the lid 18 has a frustoconical shape and/or comprises a Venturi cone. In various embodiments, the lid 18 is located proximate to, and/or includes, a sealable outlet 20 for the reaction chamber 12. In various embodiments, the reaction chamber 12 comprises a vacuum-tight, sealable furnace/oven for chemical vapor densification (e.g., CVI and/or CVD processing).

In various embodiments, the reaction chamber 12 is generally cylindrical and scalable up and/or down as desired for various applications, including appropriately scaling other components of the system 10 as well. In various embodiments, the system 10 is controlled by engineering software that collects data and/or controls the system 10, including in real-time, in various embodiments. In various embodiments, a pressure within the system 10 is maintained at or below a predetermined set pressure of, approximately, 100 Torr (13,332.2 pascal (Pa)), including either at a constant set pressure and/or as pulsed from a low pressure to the predetermined set pressure. In various embodiments, other pressures and/or arrangements are suited.

In various embodiments, a support 22 is located within the reaction zone 16 of the reaction chamber 12 and supports one or more substrates 24 located and/or placed within the reaction chamber 12 to begin the CVI/CVD process. In various embodiments, the support 22 is electrically isolated from the rest of the reaction chamber 12, such as comprising an in-situ electrically isolated sample balance and/or load cell. In various embodiments, the substrates 24 include, for example, porous substrates, carbon fiber preforms, silicon carbide fiber preforms, close packed particulates with silicon carbide, etc. In various embodiments, the substrates 24 are charged or grounded by an AC voltage that is frequency-varied and positively or negatively biased. In various embodiments, the substrates 24 are charged or grounded by a DC voltage that is positively or negatively biased. In various embodiments, various walls of the retort 14 are grounded, negatively charged, or positively charged, as suited for particular applications. In various embodiments, the various walls of the retort 14 are isolated from the substrates 24.

In various embodiments, virgin gas is input into the reaction zone 16 from a virgin gas source 26 via an inlet 28 into the reaction chamber 12, the inlet 28 being generally distal the outlet 20 of the reaction chamber 12. As used herein, "virgin gas" is gas that has not yet flowed through the reaction chamber 12 and/or not yet been previously recirculated/recycled within the system 10. Virgin gases may include, but are not limited to, disilane and/or silane, including in combination with one or more hydrocarbon reactive gases, such as butane, ethane, methane, natural gas mixtures, propane, and/or other hydrocarbon reactive gases.

In various embodiments, a mass flow controller 30 is intermediate the virgin gas source 26 and the inlet 28 and controls and/or measures a flow rate of the virgin gas from the virgin gas source 26 into the reaction zone 16 of the reaction chamber 12. For example, in various embodiments, the mass flow controller 30 allows and/or causes the virgin gas source 26 to output between, approximately, 0-150 liters/minute (0-39.6 gallons/minute) of virgin gas into the reaction zone 16; and/or between, approximately, 0-100 liters/minute (0-26.4 gallons/minute); and/or between, approximately, 0-50 liters/minute (0-13.2 gallons/minute). In various embodiments, the mass flow controller 30 changes the amount of virgin gas input into the reaction zone 16 from the virgin gas source 26 in real-time, such as in response to the CVI/CVD processes (e.g., in conjunction with suitable sensors 82 and/or the like) and/or based on other adjustments to the system 10 as well.

In various embodiments, one or more inert gas inlets 32 are also fluidly coupled to the reaction chamber 12. In various embodiments, inert, and/or substantially inert (i.e., less reactive), gases (e.g., argon, helium nitrogen ($N_2$), xenon, etc.) are input from the one or more inert gas inlets 32 into the reaction chamber 12 in order to force atmospheric gases out of the reaction zone 16.

In various embodiments, effluent gas exits the reaction zone 16 via the outlet 20 during and/or following densification. Upon exiting the outlet 20, the effluent gas is directed through one or more conduits 34, 36 enroute to a trap 38.

In various embodiments, an electric arc is used downstream of the outlet 20 and intermediate the outlet 20 and the trap 38, such as a variable frequency or fixed DC corona plasma 40 and an array of plasma conduits 42 located between the outlet 20 and the trap 38 along the conduits 34, 36. In various embodiments, the plasma 40 begins fragmenting heavy hydrocarbons, silanes, and/or carbosilanes from the effluent gas, including principally as liquids and/or tars, in order to begin breaking down and starting to form lighter hydrocarbon and silane reaction gases for subsequent recirculating and/or recycling back to the reaction chamber 12. In this context, hydrocarbons, silanes, and/or carbosilanes are considered "heavy" when they comprise four or more (e.g., four or five) carbon and/or silicon atoms and "light" when they comprise three or fewer (e.g., zero to three) carbon and/or silicon atoms.

In various embodiments, the array of plasma conduits 42 begin fragmenting heavier hydrocarbons, silane, and/or carbosilane chains comprising four or more (e.g., four or five) carbon and/or silicon atoms into lighter hydrocarbons, silane, and/or carbosilane chains comprising three or fewer carbon and/or silicon atoms.

In various embodiments, the hydrocarbons, silane, and/or carbosilane chains exiting the outlet 20 along with the effluent gas cross the array of plasma conduits 42 in order to continue exiting from the conduit 36.

In various embodiments, a frequency and/or voltage applied by the array of plasma conduits 42 is selected to begin breaking down particular molecule sizes. In various embodiments, for example, the frequency and/or voltage of the array of plasma conduits 42 is selected to fragment hydrocarbon, silane, and/or carbosilane molecules comprising four or more (e.g., four or five) carbon and/or silicon atoms.

In various embodiments, the trap 38, which is downstream of the reaction chamber 12, comprises a whipper 44 having one or more sets of rotating blades configured to filter (i.e., to remove) heavy hydrocarbons, silanes, and/or hydrocarbons from the effluent gas. For example, the trap 38 causes heavier hydrocarbons, silane, and/or carbosilane molecules, such as hydrocarbons, silane, and/or carbosilane molecules having four or more (e.g., four or five) carbon and/or silicon atoms, to filter out lighter hydrocarbons, silane, and/or carbosilane, such as hydrocarbons, silane, and/or carbosilane molecules having less than four carbon and/or silicon atoms. As a result, the trap 38 comprises a stage one trap, in various embodiments, configured to filter heavy hydrocarbons, silanes, and/or hydrocarbons.

In various embodiments, the trap 38 is also in fluid communication with a downstream cryogenic cooler 46, such as a helium cryogenic cooler, cooled by helium, and/or a liquid nitrogen condenser, cooled by liquid nitrogen. In various embodiments, the cryogenic cooler 46 is configured to condense the light hydrocarbons, silanes, and/or hydrosilanes exiting from the trap 38. For example, the cryogenic cooler 46 causes the light hydrocarbons, silane, and/or carbosilane molecules, such as hydrocarbons, silane, and/or carbosilane molecules having three or fewer carbon and/or silicon atoms, to condense, leaving still lighter hydrocarbons, silane, and/or carbosilane, such as hydrocarbons, silane, and/or carbosilane molecules having two or fewer carbon and/or silicon atoms. As a result, the cryogenic cooler 46 comprises a stage two trap, in various embodiments, configured to condense light hydrocarbons, silanes, and/or hydrocarbons In various embodiments, the cryogenic cooler 46 also comprises a hydrogen extraction component. For example, in various embodiments, the cryogenic cooler 48 comprises a membrane filter to extract excess hydrogen as hydrogen gas ($H_2$), which evolves as the hydrocarbons, silane, and/or carbosilane condense within the cryogenic cooler 46.

Filtering and/or condensing hydrocarbons, silane, and/or carbosilane gases allows hydrogen, which remains in a gaseous state, to be extracted from the effluent gas output from the outlet 20 of the reaction chamber 12.

Within the system 10, a first frustoconical conduit 48 couples the trap 38 to the cryogenic cooler 46, in various embodiments. In various embodiments, the first frustoconical conduit 48 facilitates a Venturi effect between the trap 38 and the cryogenic cooler 46, including via compression.

In various embodiments, gaseous hydrogen exits the cryogenic cooler 46 along an exit path 50 (representatively comprising arrows 50a, 50b, 50c, 50d, 50e, 50f, and 50g), as elaborated upon herein.

Within the system 10, a second frustoconical conduit 52 forms a separate exit from the cryogenic cooler 46 via an alternative exit conduit 54. In various embodiments, the second frustoconical conduit 52 facilitates a Venturi effect between the cryogenic cooler 46 and the alternative exit conduit 54, including via expansion.

In various embodiments, expanding hydrocarbons exiting the cryogenic cooler 46 via the second frustoconical conduit 52 facilitate a phase change of the hydrocarbons, silane, and/or carbosilane from a liquid state to a gaseous state. Once all, or most, of the hydrogen is removed from the effluent stream, the liquefied hydrocarbons, silanes, or carbosilanes are heated within, or shortly after, the exit conduit 54 by an in-line heater 56, in various embodiments. This heating returns the small hydrocarbons, silanes, or carbosilanes to a gaseous state.

In various embodiments, a valve 58 in communication with the exit conduit 54 is opened, and one or more of a primary pump 60 and/or secondary pump 62, located along a recirculation path 64 downstream of the second frustroconcial conduit 52, are activated in order to draw gaseous hydrocarbons, silane, and/or carbosilane from the exit conduit 54 and into the recirculation path 64 (representatively comprising arrows 64a, 64b, 64c, 64d, 64e, 64f, and 64g).

In various embodiments, flow through the recirculation path 64 is controlled via the valve 58, the primary pump 60, and/or the secondary pump 62. In various embodiments, a one-way flow valve 66 and/or flow meter 68 is/are intermediate the secondary pump 62 and the inlet 28 of the reaction chamber 12. In various embodiments, one or more of the valve 58, the primary pump 60, and/or the secondary pump 62 control the flow of recirculated gas back into the reaction chamber 12.

In various embodiments, this recirculated gas and virgin gas from the virgin gas source 26 are separately input back into the reaction chamber 12 via the inlet 28 (e.g., via discrete entrances). In various embodiments, the recirculated gas and the virgin gas from the virgin gas source 26 are mixed at the inlet 28 prior to being introduced into the reaction chamber 12.

In various embodiments, hydrocarbon gases, including heavy hydrocarbons, silanes, and carbosilanes are recycled/recirculated to improve the rate of densification and/or efficiency of the CVI/CVD processes within the system 10, which continue after the gases recirculate through the recirculation path 64.

Referring again to the exit path 50 from the cryogenic cooler 46, flow of the effluent gas and/or hydrogen gas extracted by the cryogenic cooler 46 is controlled via an exit valve 70, a throttle valve 72, a turbo pump 74, a roughing pump 76, and/or a thermal oxidizer 78 disposed in generally serial communication with one another downstream along the exit path 50. In various embodiments, discharge from the thermal oxidizer 78 is vented to an exhaust 80 of the system 10.

In various embodiments, pressure within the exit path 50 is maintained at a desired level by opening and closing the exit valve 70 and/or the throttle valve 72, as well as by decreasing and/or increasing the speed of the turbo pump 74 and/or the roughing pump 76.

In various embodiments, one or more pressure transducers/sensors 82 are also located throughout the system 10, such as to measure flow levels at various points within the system 10.

As described herein, recirculated effluent gases within the system 10 increase a number of moles of small carbon and/or silicon molecules flowing through the reaction zone 16 of the reaction chamber 12 and that are available for additional CVI/CVD processing of the substrate 24, including without increasing the flow and/or amount of virgin (i.e., initial) gas input into the system 10 from the virgin gas source 26. This decreases the amount of, for example, methane, as a virgin gas, that is used in densification, which has positive green-house effects, in various embodiments. In addition, the recirculated silane is more reactive than methane, in various embodiments. In addition, the system 10 also alleviates machining the substrate 24 to re-open surface pores thereon that can close during densification. As a result, the recirculated silane gases within the system 10 increase the densification rate of the substrate 24, including as more effective molecules pass through the reaction zone 16 of the reaction chamber 12 and increase a number of molecules that make collisions (i.e., have an opportunity to bond with) with the substrate 24. Accordingly, in various embodiments, the system 10 (and methods below) allows enhanced and/or faster densification of the substrate 24, including greater than, for example, 2.0 g/cc, as well as greater throughput, reduced by-product mitigation, etc.

Figure 2:
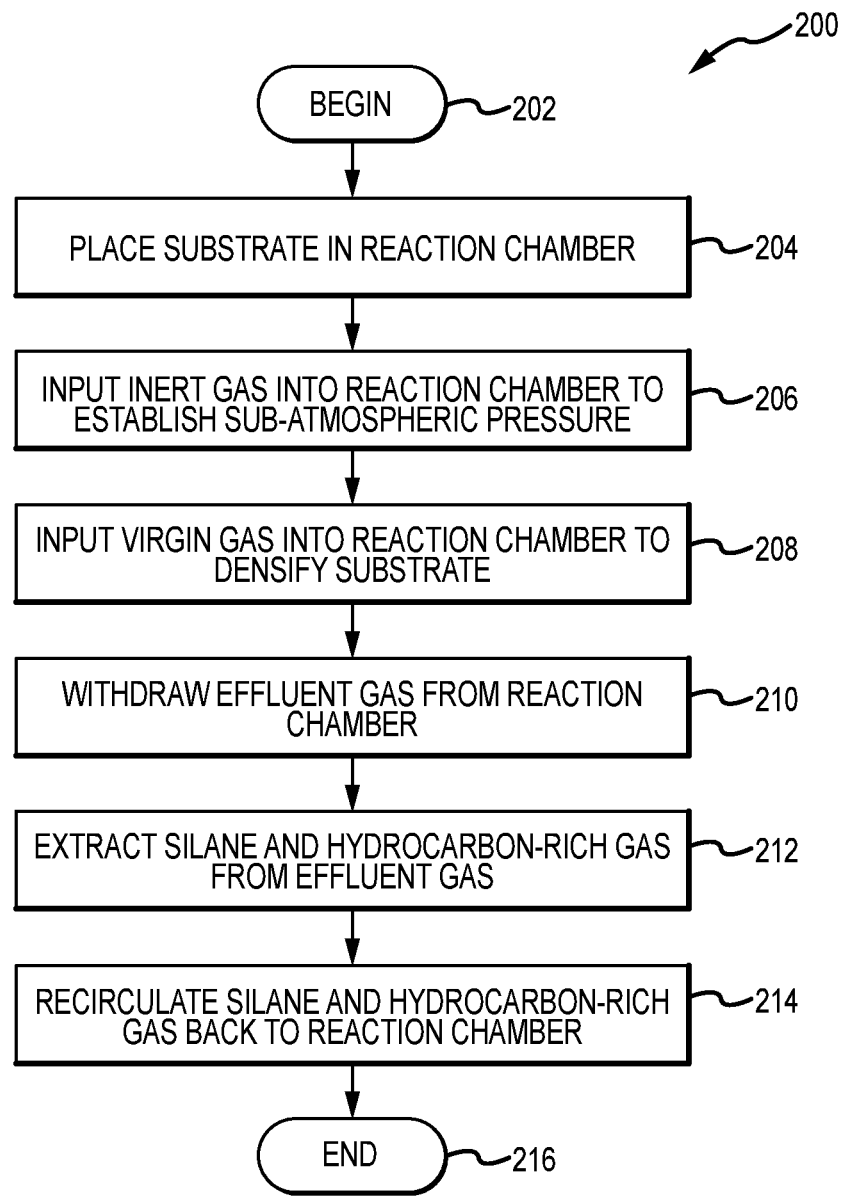
FIG. 2 illustrates a first method of chemical vapor deposition suitable for densifying components, in accordance with various embodiments.

Referring now also to FIGS. 1-2, a method 200 for chemical vapor densification (e.g., chemical vapor infiltration (CVI) and/or chemical vapor deposition (CVD)) is illustrated, in accordance with various embodiments. More specifically, the method 200 begins at a step 202, after which one or more substrates are placed in a reaction chamber in step 204, such as placing the one or more substrates 24 of FIG. 1 into the reaction chamber 12 of FIG. 1. Thereafter, inert gas is input into the reaction chamber to establish a sub-atmospheric pressure within the reaction chamber in step 206, such as from one or more inert gas sources 32 of FIG. 1. In various embodiments, the inert, and/or substantially inert, gases include one or more of argon, helium, nitrogen (N2), xenon, etc., and they force atmospheric gases out of the reaction chamber. In various embodiments, the sub-atmospheric pressure is maintained at or below a predetermined set pressure of, approximately, 100 Torr (13, 332.2 pascal (Pa)), including either at a constant set pressure and/or as pulsed from a low pressure to the predetermined set pressure. In various embodiments, other pressures and/or arrangements are suited. After the inert gas is input into the reaction chamber in step 206, one or more virgin gases, including various combinations thereof, are input into the reaction chamber to densify the substrate in step 208, such as from the virgin gas source 26 of FIG. 1. In various embodiments, the virgin gases may include, but are not limited to, disilane and/or silane, including in combination with one or more hydrocarbon reactive gases, such as butane, ethane, methane, natural gas mixtures, propane, and/or other hydrocarbon reactive gases. Thereafter, effluent gas is withdrawn from the reaction chamber in step 210. Thereafter, silane and hydrocarbon-rich gas are extracted from the effluent gas in step 212. In various embodiments, the silane and hydrocarbon-rich gas are extracted from the effluent gas using a trap and/or a cryogenic cooler, such as the trap 38 and cryogenic cooler 46 of FIG. 1. In various embodiments, the trap includes a whipper having one or more sets of rotating blades configured to filter (i.e., to remove) heavy (e.g., comprising four to six carbon and/or silicon atoms) hydrocarbons, silanes, and/or hydrocarbons from the effluent gas, such as the whipper 44 of FIG. 1. In various embodiments, the cryogenic cooler condenses light (e.g., comprising three or fewer carbon and/or silicon atoms) hydrocarbons, silanes, and/or hydrocarbons from the effluent gas. In various embodiments, the cryogenic cooler is cooled by helium and/or liquid nitrogen. In any event, after the silane and hydrocarbon-rich gas are extracted from the effluent gas in step 212, they are recirculated and/or recycled back to the reaction chamber in step 214, after which the method 200 ends in a step 216.

In various embodiments, the method 200 further comprises one or more of extracting hydrogen from the effluent gas, oxidizing the hydrogen, and/or venting the hydrogen to an exhaust, such as through the thermal oxidizer 78 of FIG. 1. In various embodiments, the method 200 further comprises applying an electric arc, such as a plasma 40 of FIG. 1, to the effluent gas, wherein the electric arc begins fragmenting heavy hydrocarbon, silane, or carbosilane molecules comprised of four or more (e.g., four or five) carbon or silicon atoms, as part of, and/or as a precursor to, the extraction process. In various embodiments, the extraction of the method 200 comprises filtering hydrocarbon, silane, or carbosilane molecules comprised of four or more (e.g., four or five) carbon or silicon atoms. In various embodiments, the extraction of the method 200 comprises condensing hydrocarbon, silane, or carbosilane molecules comprised of four or more (e.g., four or five) carbon or silicon atoms. In various embodiments, the method 200 further comprises additionally densifying the substrate using the recirculated silane and hydrocarbon-rich gas.

Figure 3:
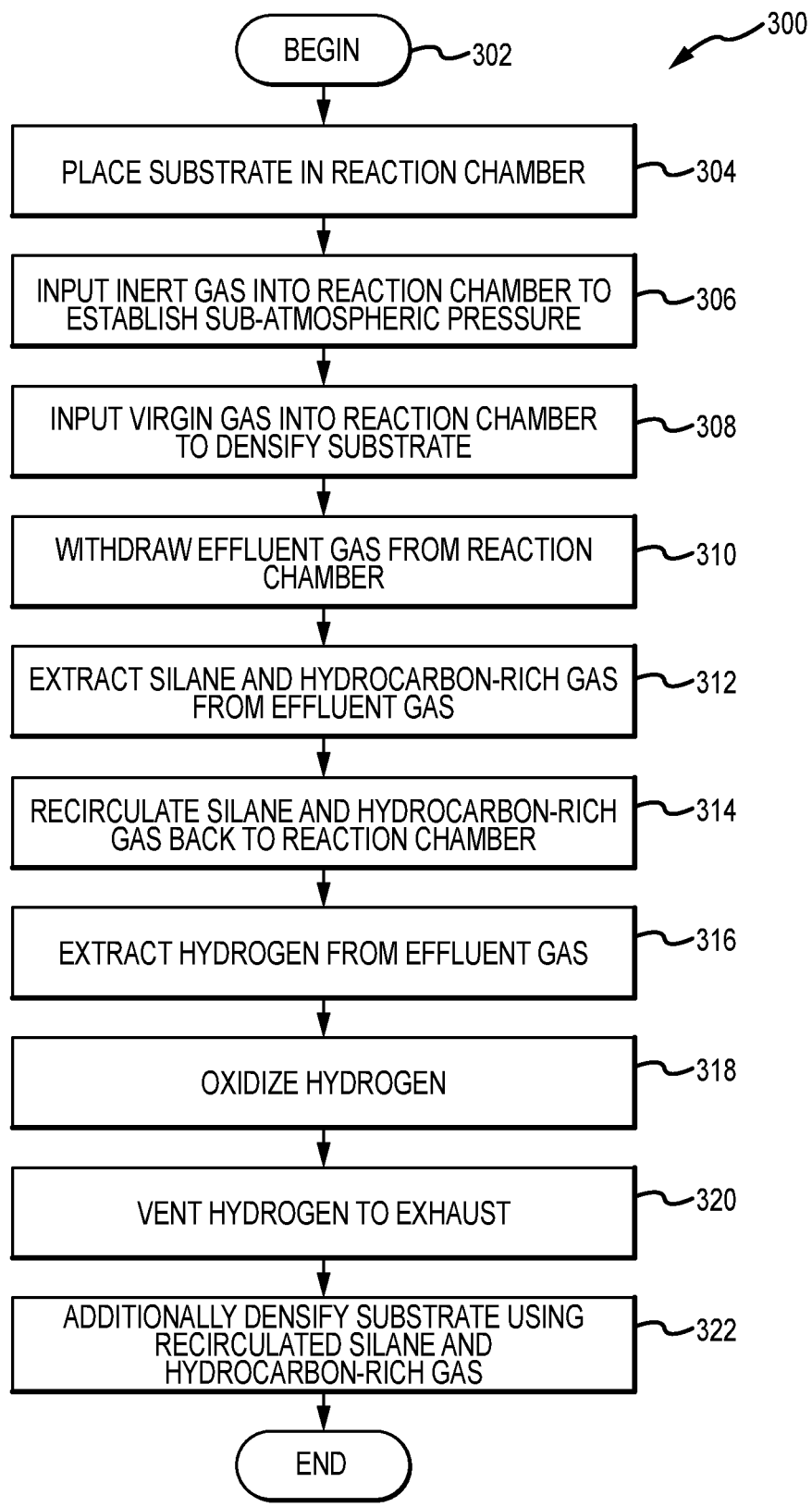
FIG. 3 illustrates a second method of chemical vapor deposition suitable for densifying components, in accordance with various embodiments.

Referring now also to FIGS. 1 and 3, a method 300 for chemical vapor densification (e.g., chemical vapor infiltration (CVI) and/or chemical vapor deposition (CVD)) is illustrated, in accordance with various embodiments. More specifically, the method 300 begins at a step 302, after which one or more substrates are placed in a reaction chamber in step 304, such as placing the one or more substrates 24 of FIG. 1 into the reaction chamber 12 of FIG. 1. Thereafter, inert gas is input into the reaction chamber 12 to establish a sub-atmospheric pressure within the reaction chamber 12 in step 306, such as from one or more inert gas sources 32 of FIG. 1. In various embodiments, the inert, and/or substantially inert, gases include one or more of argon, helium, nitrogen (N2), xenon, etc., and they force atmospheric gases out of the reaction chamber 12. In various embodiments, the sub-atmospheric pressure is maintained at or below a predetermined set pressure of, approximately, 100 Torr (13,332.2 pascal (Pa)), including either at a constant set pressure and/or as pulsed from a low pressure to the predetermined set pressure. In various embodiments, other pressures and/or arrangements are suited. After the inert gas is input into the reaction chamber 12 in step 306, one or more virgin gases, including various combinations thereof, are input into the reaction chamber 12 to densify the substrate in step 308, such as from the virgin gas source 26 of FIG. 1. In various embodiments, the virgin gases may include, but are not limited to, disilane and/or silane, including in combination with one or more hydrocarbon reactive gases, such as butane, ethane, methane, natural gas mixtures, propane, and/or other hydrocarbon reactive gases. Thereafter, effluent gas is withdrawn from the reaction chamber 12 in step 310. Thereafter, silane and hydrocarbon-rich gas are extracted from the effluent gas in step 312. In various embodiments, the silane and hydrocarbon-rich gas are extracted from the effluent gas using a trap and/or a cryogenic cooler, such as the trap 38 and cryogenic cooler 46 of FIG. 1. In various embodiments, the trap 38 includes a whipper having one or more sets of rotating blades configured to filter (i.e., to remove) heavy (e.g., comprising four to six carbon and/or silicon atoms) hydrocarbons, silanes, and/or hydrocarbons from the effluent gas, such as the whipper 44 of FIG. 1. In various embodiments, the cryogenic cooler 46 condenses light (e.g., comprising three or fewer carbon and/or silicon atoms) hydrocarbons, silanes, and/or hydrocarbons from the effluent gas. In various embodiments, the cryogenic cooler 46 is cooled by helium and/or liquid nitrogen. In any event, after the silane and hydrocarbon-rich gas are extracted from the effluent gas in step 312, they are recirculated and/or recycled back to the reaction chamber 12 in step 314. In addition to extracting the silane and hydrocarbon-rich gas from the effluent gas in step 312, hydrogen is also extracted from the effluent gas in step 316, oxidized in step 318, such as by using the thermal oxidizer 78 of FIG. 1, and vented in step 320. In various embodiments, the hydrogen waste stream is oxidized in order to safely react any silane contaminants that made it past the trap 38 and/or cryogenic cooler 46. In addition, the one or more substrates are additionally densified using the recirculated silane and hydrocarbon-rich gas in step 322, after which the method 300 ends in a step 324.

As described herein, systems and methods extract silane and hydrocarbon-rich gas from an effluent gas downstream of a chemical vapor densification furnace, such as a CVI/CVD reaction chamber, used to densify substrates, such as used in the aerospace industry. In various embodiments, the silane and hydrocarbon-rich gas are subjected to being filtered by a trap having a whipper and/or condensed by a cryogenic cooler. In various embodiments, the trap comprises a stage one trap, and the cryogenic cooler comprises a stage two trap. In various embodiments, heavier and/or longer hydrocarbons, silane, and/or carbosilane molecules, such as hydrocarbons, silane, and/or carbosilane molecules having four or more (e.g., four or five) carbon and/or silicon atoms, are treated, leaving lighter and/or shorter hydrocarbons, silane, and/or carbosilane, such as hydrocarbons, silane, and/or carbosilane molecules having four or fewer carbon and/or silicon atoms. In various embodiments, the silane and hydrocarbon-rich gas is recirculated back to the furnace and combined with new virgin gases to additionally densify the substrate, decreasing the amount of time required to do so (i.e., the number of hours on gas), as well as increasing the effectiveness of the densification. In various embodiments, an electric arc, such as a plasma, is used to fragment the chemical species in the effluent gas stream—i.e., to begin breaking down the hydrocarbons, silanes, and/or carbosilanes from the effluent gas, including principally as liquids and/or tars, in order to further treat the hydrocarbon and silane reaction gases for subsequent recirculating and/or recycling back to the furnace. In various embodiments, hydrogen is also extracted from the effluent gas stream and vented, such as through a thermal oxidizer.

Various technical effects of the foregoing include increasing the efficacy of chemical vapor densification and/or decreasing the number of cycles, power, and/or time required to achieve a desired efficacy, as well as mitigating the effects of by-products created during the process. The recirculated and/or recycled silane and hydrocarbon-rich gas improve overall chemical vapor densification (e.g., CVI and/or CVD) processes.

Benefits, other advantages, and solutions to problems have been described herein with regard to specific embodiments. Furthermore, the connecting lines shown in the various figures included herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Surface shading lines, if any, may be used throughout the figures to denote different parts or areas but not necessarily to denote the same or different materials. In some cases, reference coordinates may be specific to each figure.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A method of chemical vapor densification, comprising:
   placing a substrate in a reaction chamber;
   establishing a sub-atmospheric pressure inert gas atmosphere within the reaction chamber;
   densifying the substrate by inputting virgin gas into the reaction chamber;
   withdrawing effluent gas from the reaction chamber;
   filtering, via a first trap having a whipper with a set of rotating blades, hydrocarbon comprised of four or more carbon atoms, silane comprised of three or more silicon atoms, and carbosilane comprised of a combination of four or more carbon or silicon atoms;
   condensing, via a second trap having a cryogenic cooler, hydrocarbon comprised of three or fewer carbon atoms, silane comprised of two or fewer silicon atoms, and carbosilane comprised of a combination of three or fewer carbon or silicon atoms;
   extracting silane and hydrocarbon-rich gas from the effluent gas; and
   recirculating the silane and hydrocarbon-rich gas back to the reaction chamber.

2. The method of chemical vapor densification of claim 1, further comprising:
   extracting hydrogen gas from the effluent gas.

3. The method of chemical vapor densification of claim 2, further comprising:
   oxidizing the hydrogen gas to react any silane contaminants that are not extracted from the effluent gas.

4. The method of chemical vapor densification of claim 3, further comprising:
   venting the hydrogen gas to an exhaust.

5. The method of chemical vapor densification of claim 1, wherein the extracting comprises applying an electric arc to the effluent gas, and wherein the electric arc fragments at least one of hydrocarbon comprised of four or more carbon atoms, silane comprised of three or more silicon atoms, and carbosilane comprised of a combination of four or more carbon or silicon atoms.

6. The method of chemical vapor densification of claim 1, further comprising:
   additionally densifying the substrate using the recirculated silane and hydrocarbon-rich gas.

7. A method of chemical vapor densification, comprising:
   placing a substrate in a reaction chamber;
   establishing a sub-atmospheric pressure inert gas atmosphere within the reaction chamber;
   densifying the substrate by inputting virgin gas into the reaction chamber;
   withdrawing effluent gas from the reaction chamber;
   extracting silane and hydrocarbon-rich gas from the effluent gas;
   recirculating the silane and hydrocarbon-rich gas back to the reaction chamber;
   extracting hydrogen from the effluent gas;
   oxidizing the hydrogen to react any silane contaminants that are not extracted from the effluent gas;
   venting the hydrogen to an exhaust; and
   additionally densifying the substrate using the recirculated silane and hydrocarbon-rich gas;
   wherein the extracting silane and hydrocarbon-rich gas from the effluent gas comprises:
      filtering, via a first trap having a whipper with a set of rotating blades, hydrocarbon comprised of four or more carbon atoms, silane comprised of three or more silicon atoms, and carbosilane comprised of a combination of four or more carbon or silicon atoms, and
      condensing, hydrocarbon comprised of three or fewer carbon atoms, silane comprised of two or fewer silicon atoms, and carbosilane comprised of a combination of three or fewer carbon or silicon atoms.

8. The method of chemical vapor densification of claim 7, wherein the extracting silane and hydrocarbon-rich gas from the effluent gas further comprises applying an electric arc to the effluent gas, and wherein the electric arc begins fragmenting the hydrocarbon, silane, or carbosilane molecules.

* * * * *